US008284621B2

(12) United States Patent
Dreps et al.

(10) Patent No.: US 8,284,621 B2
(45) Date of Patent: Oct. 9, 2012

(54) STROBE OFFSET IN BIDIRECTIONAL MEMORY STROBE CONFIGURATIONS

(75) Inventors: Daniel M. Dreps, Georgetown, TX (US); Kevin C. Gower, LaGrangeville, NY (US); Michael K. Kerr, Johnson City, NY (US); Kyu-hyoun Kim, Mount Kisco, NY (US); David W. Mann, Newark Valley, NY (US); James A. Mossman, Raleigh, NC (US); Michael A. Sorna, Hopewell Junction, NY (US); Robert B. Tremaine, Stormville, NY (US); William M. Zevin, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 299 days.

(21) Appl. No.: 12/705,674

(22) Filed: Feb. 15, 2010

(65) Prior Publication Data

US 2011/0199843 A1  Aug. 18, 2011

(51) Int. Cl.
G11C 8/18 (2006.01)
(52) U.S. Cl. .................................. 365/193; 365/230.03
(58) Field of Classification Search .................. 365/193, 365/230.03
See application file for complete search history.

(56) References Cited

U.S. PATENT DOCUMENTS

| 4,947,376 | A | * | 8/1990 | Arimoto et al. ............... 365/205 |
| 5,161,121 | A | * | 11/1992 | Cho ............................ 365/189.06 |
| 2002/0034101 | A1 | * | 3/2002 | Semi ......................... 365/185.23 |
| 2004/0022090 | A1 | * | 2/2004 | Hasegawa et al. ............. 365/199 |
| 2005/0213396 | A1 | | 9/2005 | Aoki |
| 2007/0002642 | A1 | | 1/2007 | Butt et al. |
| 2008/0239841 | A1 | | 10/2008 | Carnevale et al. |
| 2009/0122602 | A1 | * | 5/2009 | Takemura et al. ............. 365/163 |

FOREIGN PATENT DOCUMENTS

WO  2006023387 A1  3/2006
WO  2008000059 A1  1/2008

OTHER PUBLICATIONS

"Bios and Kernel Developer's Guide for AMD NPT Family 0Fh Processors", Revision 3.08, Jul. 2007, pp. 195-197 http://mirror.leaseweb.com/NetBSD/misc/cegger/hw_manuals/amd/bkdg_k8fg_pub_32559.pdf.

* cited by examiner

*Primary Examiner* — Michael Tran
(74) *Attorney, Agent, or Firm* — Robert R. Williams

(57) ABSTRACT

A method and apparatus for determining correct timing for receiving, in a host in a memory system, of a normal toggle transmitted by an addressed memory chip on a bidirectional data strobe. An offset in the data strobe is established, either by commanding the addressed memory chip, in a training period, to drive the data strobe to a known state, except during transmission of a normal toggle, or by providing a voltage offset between a true and a complement phase in the data strobe, or by providing a circuit bias in a differential receiver on the host the receives the data strobe. A series of read commands are transmitted by the host to the addressed memory chip, which responds by transmitting the normal toggle. Timing of reception of the normal toggle as received by the host chip is adjusted until the normal toggle is correctly received.

7 Claims, 8 Drawing Sheets

Training Period having Multiple Reads after MRS Cmd
Sets DQS Low Drive Bit

How to determine DQS receiver enable time at host

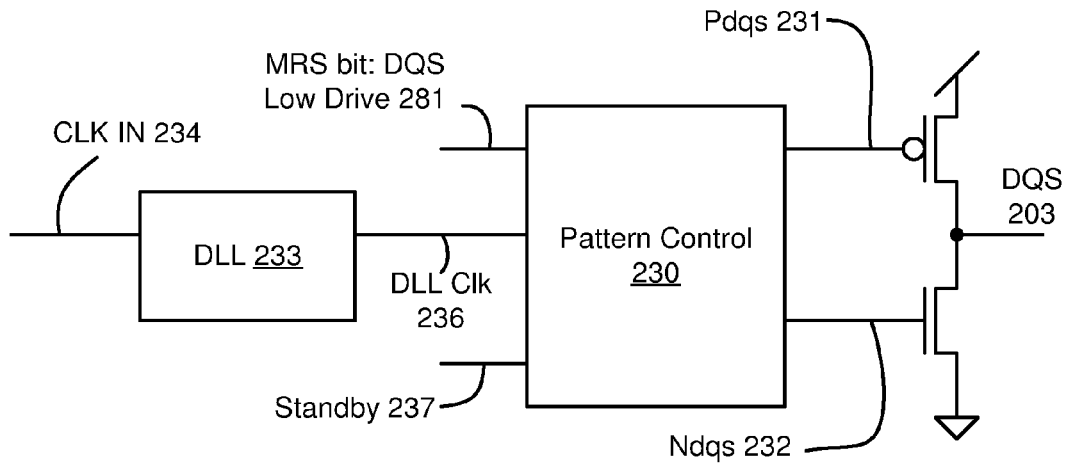

Normal Mode: DQS Low Drive Mode MRS Bit = "0"

|  |  | Standby | Preamble | Normal Toggle |
|---|---|---|---|---|
| Pdqs | DLL Clk rising | H | H | L |
| Pdqs | DLL Clk falling | H | H | H |
| Ndqs | DLL Clk rising | L | H | L |
| Ndqs | DLL Clk falling | L | H | H |

DQS Low Drive Mode: DQS Low Drive Mode MRS Bit = "1"

|  |  | Standby | Preamble | Normal Toggle |
|---|---|---|---|---|
| Pdqs | DLL Clk rising | H | H | L |
| Pdqs | DLL Clk falling | H | H | H |
| Ndqs | DLL Clk rising | H | H | L |
| Ndqs | DLL Clk falling | H | H | H |

Fig. 5
Block Diagram and Truth Tables for Control of Pdqs and Ndqs

Host training flow for a training period

Showing DQS and DQS# with and without offset turned on

Controls in Host to Train Timing of DQS Receiver Enable

STROBE OFFSET IN BIDIRECTIONAL MEMORY STROBE CONFIGURATIONS

FIELD OF THE INVENTION

This invention relates generally to memory, wherein a bidirectional strobe signal is used.

SUMMARY OF EMBODIMENTS OF THE INVENTION

A typical memory system includes a data strobe (signal that is toggled by a memory chip when the memory chip is returning data to the host respondent to a read command sent from the host to the memory chip. The host knows "approximately" when the data strobe toggle will arrive at the host, but not "exactly" when. Variations in exactly when the toggle arrives at the host are caused by circuit performance variations, and physical lengths between each memory chip and the host. Temperature and voltage variations during operation of the memory system may force periodic re-training. The host must train a receiver on the host to correctly receive the toggle signal sent on the data strobe by the memory chip. Embodiments of the invention, described herein, provide efficient apparatus and methods for training the receiver on the host during a training period.

Many memory systems, such as shown in FIG. 1, comprise a host 101 and a plurality of memory chips 102 (memory 102A, 102B shown for exemplary purposes). Host 101 transmits commands to a particular memory chip, and transmits data (for writes) on data 108, and receives data (for reads) on data 108. Commands may be sent on data 108 or on a separate command bus (not shown). Data 108 is shown as a bidirectional data bus. A clock, CLK, is transmitted from host 101 to the one or more memory chips 102 on a clock signal (for simplicity not shown in the schematic, but shown as a waveform in FIG. 1).

Using memory 102A as an exemplary target of a read command 109, memory 102A drives data strobe 105 from a Hi-Z (high impedance state) to a low state during a preamble 110. Preamble 110 is longer than a low state of any particular down level during a normal toggle 111.

After driving data strobe 105 and completing one or more transfers of data, each unit (host 101, memory 102A, or memory 102B) relinquishes control of data strobe 105 by turning its driver off, thereby allowing data strobe 105 to be in the Hi-Z state until such time as host 101, memory 102A, or memory 102B again drives data strobe 105. During the time that data strobe 105 is in the Hi-Z state, data strobe 105 has a voltage that is undefined, that is, the voltage may be in a logical "1" state, a logical "0" state, or may be at some voltage where a receiver may even be oscillating. In many implementations of data strobe 105, as shown in FIG. 1, data strobe is a differential signal and further comprises a true and a complement phase, shown as DQS 103 (the true phase of data strobe 105, shown as a solid line) and DQS# 104 (the complement phase of data strobe 105, shown as a dashed line). When data strobe 105 is in Hi-Z, voltages on both DQS 103 and DQS# 104 are undefined.

The lack of definition of voltage(s) on data strobe 105 requires the preamble, in prior art bidirectional data strobe signaling, when a receiver in host 101 is being trained as to when to expect the normal toggle driven by one of the memory chips 102. When host 101 transmits a read command 109 during a training period, memory 102A (in the example, if the read command 109 were directed to memory 102B, memory 102B would respond) will take control of data strobe 105 and will drive a preamble 110, with Data strobe 105 driven to a predefined voltage (as shown, DQS 103 driven low and DQS# 104 driven high) for a predetermined time period, the predetermined time period being longer than any down level time periods during a normal toggle 111. Other preamble schemes, such as a "toggle preamble" are also known. Host 101 does not know exactly when strobes will return from memory 102A, just approximately when the strobes will return. However, host 101 does know that preamble 110 will be longer than any down level period during normal toggle 111. Host 101 will sample data strobe 105 at the known toggle rate, looking for a "001010" pattern, the "00" being interpreted as the preamble. Host 101 can adjust sampling times earlier and/or later until the "001010" pattern is found. During a time when data strobe 105 is in Hi-Z, data strobe 105 may well be "00" as values may be "1" or "0" at any particular time. Again, the host knows an approximate arrival time of the data strobe pulses, but not an exact time until training of a receiver in the host is complete.

As clock frequencies become faster, an actual time when strobes and data come back to the host becomes more unknown because latency at the memory controller side in terms of number of clock cycles becomes larger as the clock period becomes shorter. The host needs to train its receiver enable signal so that it is activated at a correct time (enabled during the preamble) to avoid receiving any glitch because strobes are in Hi-Z and may be sensed at an uncertain level if the receiver enable signal is activated too early, or a strobe pulse may be clipped if the receiver enable signal is activated too late. Training for proper timing of receiver enable signal becomes more difficult as clock frequency increases because at an initial state the host does not know where the beginning of the strobe or data is, and the host must guess using some rough timing to begin the training procedure. The guess should be accurate enough not to fall during the Hi-Z period or after the normal toggle 111 period.

If the data strobe signal is not uncertain, training is greatly facilitated.

Embodiments of the current invention teach apparatus and methods to eliminate uncertainty associated with Hi-Z states on a data strobe.

In an embodiment of the invention, a memory system comprises a bidirectional data strobe; one or more memory chips coupled to the bidirectional data strobe; and a host, such as a memory controller coupled to the bidirectional data strobe. The host further comprises: a receiver to receive signals from the bidirectional data strobe; a circuit to pass an output from the receiver to circuitry on the host only when the circuit is enabled by a receiver enable; a training control to, during a training period, transmit commands to the one or more memory chips and to determine a correct timing of the receiver enable, the training control further configured to ensure that the bidirectional data strobe has a particular voltage value during the training period.

In a method embodiment of the invention, a correct timing of a DQS receiver enable in a host connected to one or more memory chips using a bidirectional data strobe comprises: transmitting a first Mode Register Set (MRS) command to set a DQS drive bit on an addressed memory chip to an active state on the addressed memory chip; assuming an initial timing for a DQS receiver enable; iteratively performing the following blocks: issuing a read command to the addressed memory chip; determining if timing of the DQS receiver enable is correct; when the timing of the DQS receiver is correct, issuing a second MRS command to set the DQS drive bit to an inactive state on the addressed memory chip and ending the iteration; and when the timing of the DQS receiver is not correct, adjusting the timing of the DQS receiver enable and continuing the iteration.

BRIEF DESCRIPTION OF THE DRAWINGS

FIG. 5 shows control of a DQS driver in a memory chip and how the DQS driver is driven to high and low states.

DETAILED DESCRIPTION OF THE EMBODIMENTS

Figure 1:
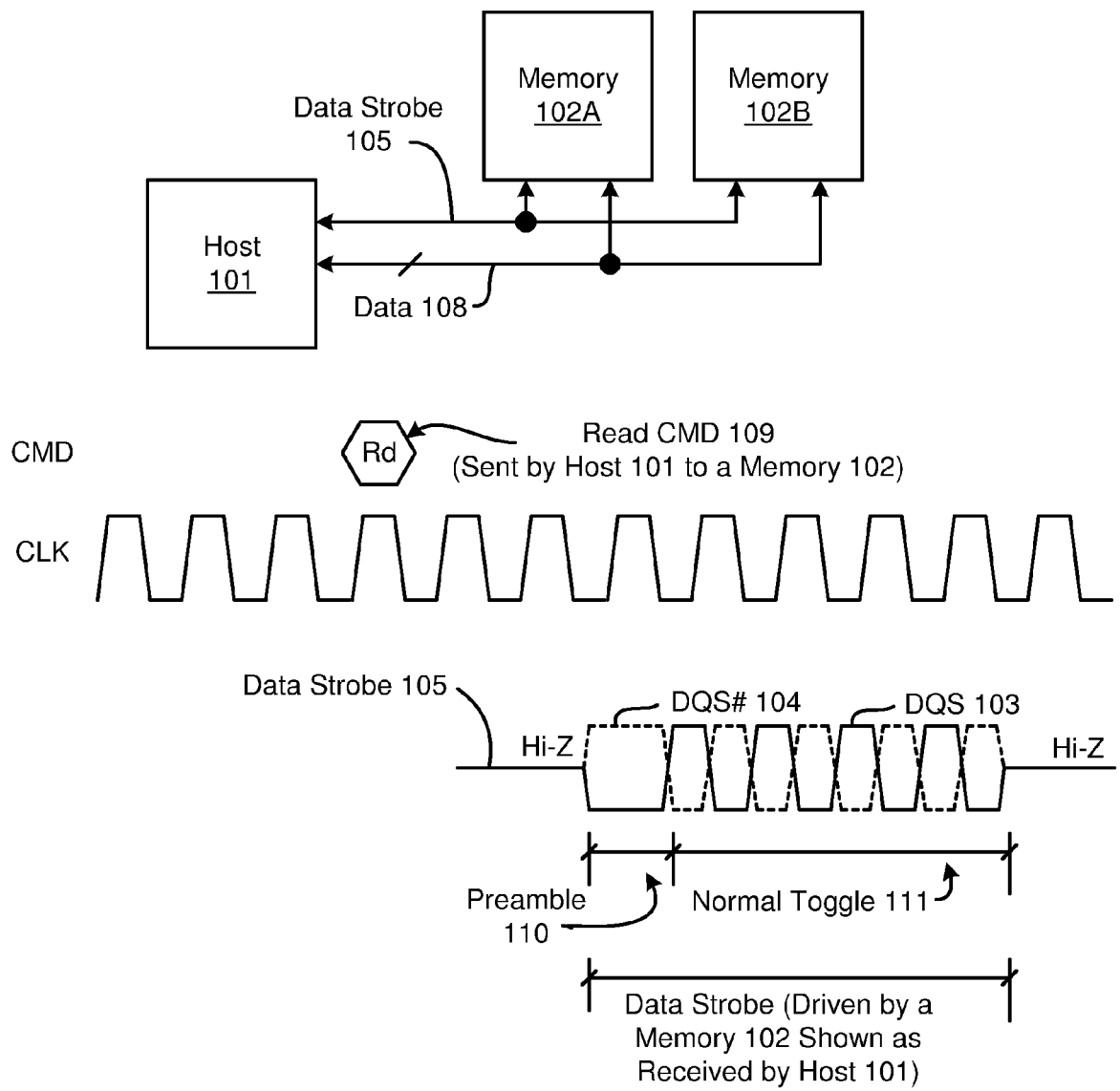
FIG. 1 shows a block diagram and waveforms of a prior art memory system.

In the following detailed description of embodiments of the invention, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

Embodiments of the present invention provide for elimination of data strobe uncertainties.

In a first embodiment, during a training period of a receiver enable on a host, prior to a read command, a Mode Register Set (MRS) command is sent by the host to a memory chip that, responsive to the MRS command, sets a DQS drive bit in a mode register on the memory chip. It will be understood that MRS is simply an exemplary command name that sets the DQS drive bit in the mode register. Other command names that similarly set a bit in a memory chip to perform the equivalent functions described herein are to be considered to be equivalent. The addressed memory chip responds by driving a data strobe to a known value. For exemplary purposes "0" will be used for the known value, and the DQS drive bit will be called the DQS low drive bit; however those of skill in the art will understand that implementations in which the data strobe is driven to a logical "1" is an alternative. The DQS low drive bit in the mode register will cause the memory chip to drive to the low value, except when the memory chip is driving a normal toggle back to the host. A truth table for the DQS strobe as driven by an addressed memory chip is shown in FIG. 5 and explained later with reference to FIG. 5. The host may transmit a plurality of read commands during the training period, adjusting timing of a receiver enable (often called a DQS receiver enable) on the host chip until the receiver enable on the host chip is properly timed to receive data strobe from the memory chip, and the data strobe is then correctly driven to logic on the host. Following determination of proper timing of the DQS receiver for reception of data strobe from the memory chip, the proper timing is stored in the host chip, associated with the memory chip. A second MRS command is then sent by the host to the memory chip to turn the DQS low bit in the mode register off.

In a second embodiment, in which the data strobe is a differential signal, during a training period the host provides an offset between a true signal and a complement signal that make up the data strobe. The offset may be a voltage offset imposed between the true signal and the complement signal, or may be an offset created in the receiver on the host. The offset is maintained during the training period for reception of data strobe from the memory chip. As above, the host stores timing information determined during the training period for the memory chip. When training is completed for a memory chip, the offset may be removed, or, if additional memory chip(s) on data strobe 205 exist, the offset may be continued until host receiver timings for the additional memory chip(s) have similarly been determined.

Figure 2:
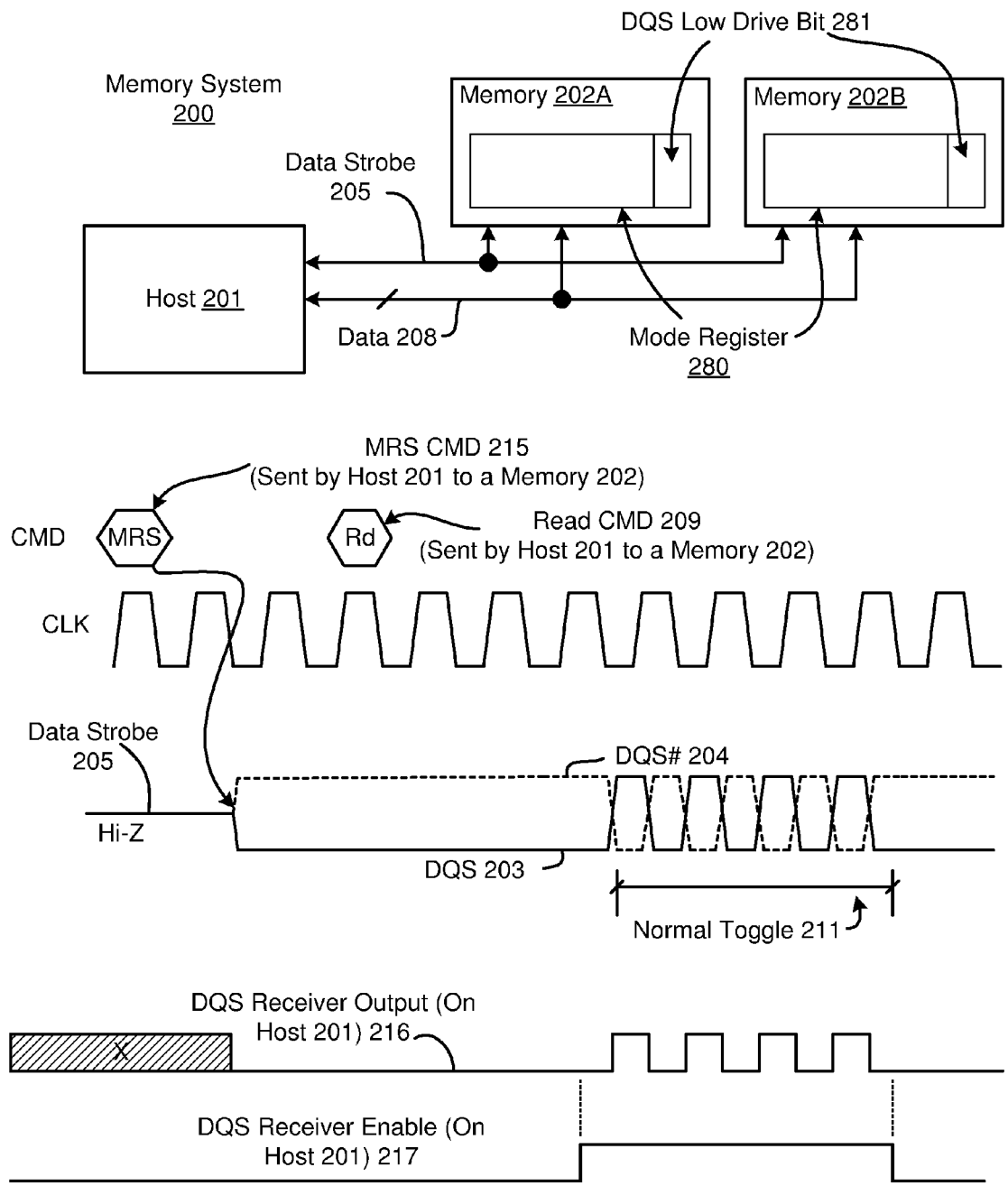
FIG. 2 shows a block diagram and waveforms of a memory system embodiment of the present invention.

With reference now to FIG. 2, a memory system 200 is shown, comprising a host 201, one or more memory chips 202 (shown as memory 202A and 202B for exemplary purposes), a data strobe 205 and a data 208. Data strobe 205 and data bus 208 may be bidirectional signals. As shown, data strobe 205 may be a differential signal, further comprising a true phase DQS 203, shown as a solid line in the waveform, and a complement phase DQS# 204, shown as a dashed line in the waveform. Data bus 208 is used to transmit write data from host 201 to a memory chip 202 or for a memory chip 202 to transmit data to host 201. Each memory chip 202 further comprises a mode register 280; each mode register 280 further comprises a DQS low drive bit 281. It is understood that, in alternate implementations, a "DQS low drive bit 281" may be a "DQS high drive bit" if data strobe 205 is to be driven high instead of low when active. Generically, "DQS drive bit" may be used to designate either a "DQS high drive bit" or a "DQS low drive bit".

Figure 11:
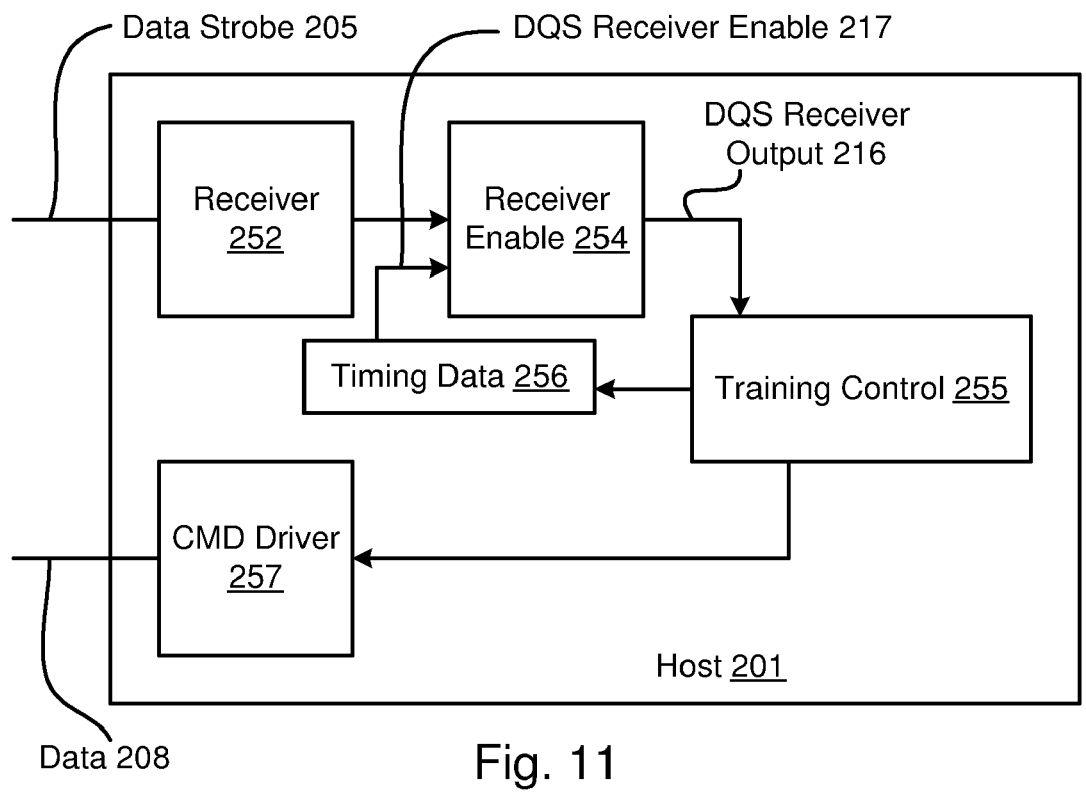
FIG. 11 shows logic block diagrams in the host suitable to perform the method of FIG. 6.

During the training period for a particular memory chip 202 the object is to determine, on the host, proper timing for DQS Receiver 217 for the particular memory chip 202 such that normal toggle 211 sent by the particular memory chip 202 is correctly received on host 201. In FIG. 2, DQS receiver enable 217 is shown to be properly timed. When DQS receiver enable 217 is properly timed, DQS receiver output 216 correctly transmits toggling on the data strobe 205 to circuitry (not shown) on host 201. Method 600 in FIG. 6 and a more detailed block diagram of circuitry in host 201 is shown in FIG. 11 and will be described later.

FIG. 2 shows a command (Mode Register Set to set a DQS drive low bit 281 in mode register 280) MRS 215 is transmitted to a memory chip 202 for which training of DQS Receiver enable 217 on host 201 is to be performed. The MRS 215 command will set (or reset) DQS low drive bit 281 in mode register 280 on the addressed memory chip 202. In response, the addressed memory chip 202 drives a low level on data strobe 205. As depicted, data strobe 205 is a differential signal and further comprises DQS 203 and DQS# 204. A read command is then driven to the addressed memory chip 202. During the training period the addressed memory chip 202 responds, driving a normal toggle 211 back to host 201. The addressed memory chip 202 will drive data strobe 205 as long as the DQS drive low bit 281 is active. The addressed memory chip 202 will drive a "0" on data strobe 205 except during normal toggle 211. When the DQS drive low bit in the addressed memory chip 202 is reset by a subsequent MRS 215 command, memory chip 202 will not actively drive data strobe 205 except when performing a normal toggle 211. See FIG. 5 and discussion thereof for description of operation of DQS drive low bit 281 in controlling values on DQS 203 and DQS# 204.

Figure 3:
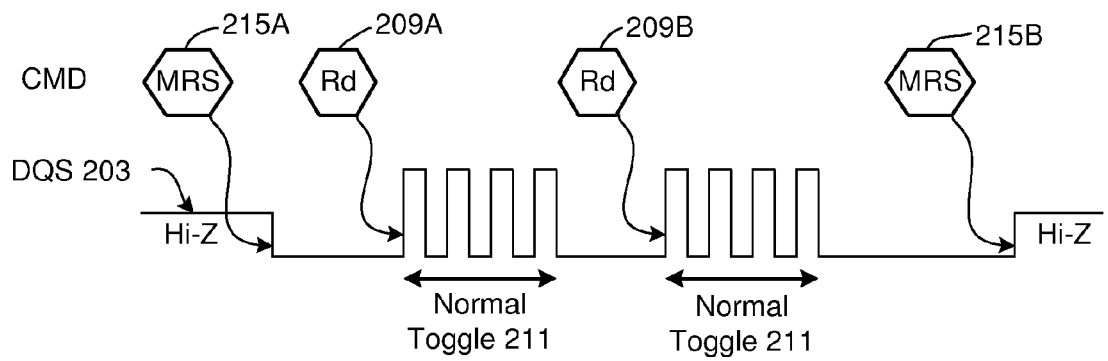
FIG. 3 shows a waveform of a training period having multiple read commands directed to a memory chip.

FIG. 3 shows DQS 203 during a training period comprising a plurality of read 209 commands. Assume that host 201 is training to properly time DQS receiver enable 217 for memory chip 202A (FIG. 2). At the beginning of the training period, DQS 203 is in a Hi-Z state. For simplicity, DQS# 204 is not shown in FIG. 3. MRS 215A (a first MRS 215 command to activate DQS low drive bit 281 on memory chip 202A) is transmitted by host 201 to memory chip 202A. As described above, memory chip 202A responds by driving DQS 203 low as shown in FIG. 3. Subsequently, host 201 transmits a first read command 209A to memory chip 202A. Memory chip 202A responds by transmitting a normal toggle 211. Host 201 then drives a second read command, read 209B, and memory chip again drives a normal toggle 211. Host 201 may drive as many read 209 commands as is required to determine proper timing of DQS receiver enable 217.

Figure 4:
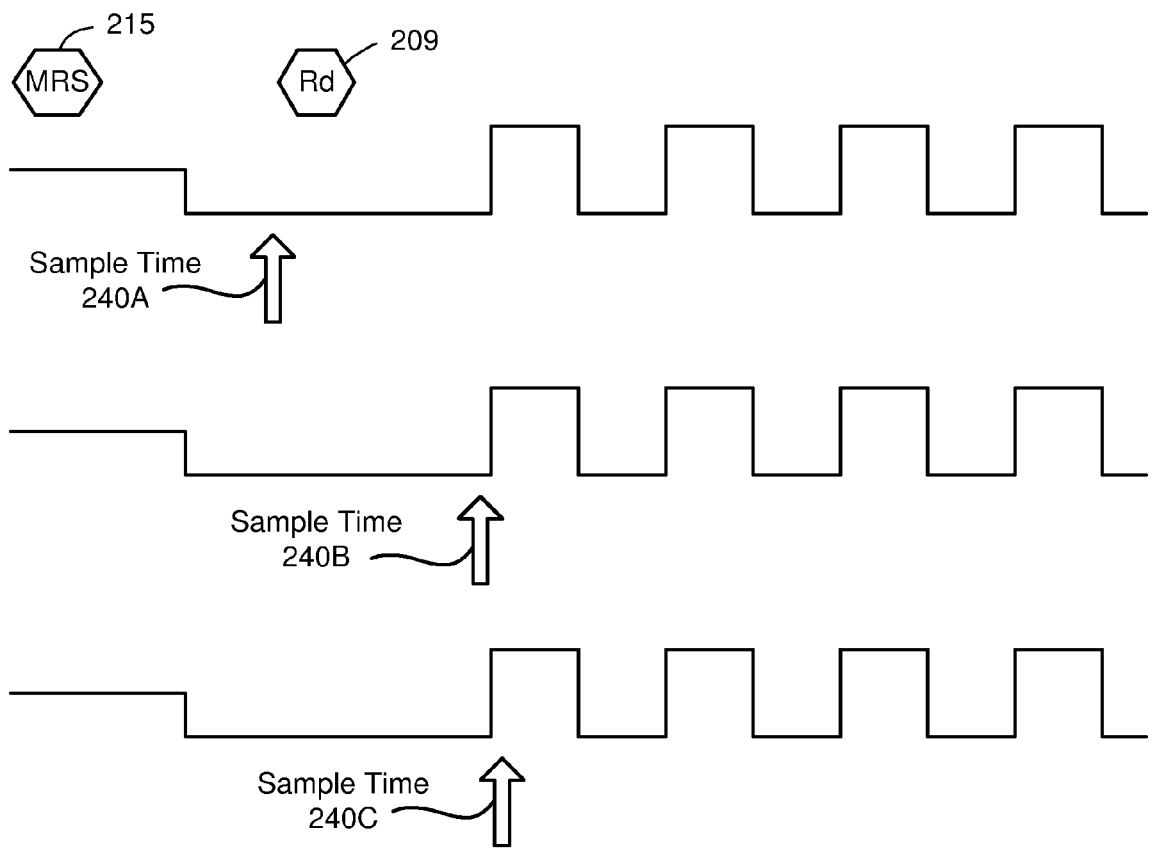
FIG. 4 illustrates moving a sample time during a training period to determine when a normal toggle transition arrives from a memory chip to a host.

FIG. 4 shows how host 201 may train DQS receiver enable 217 by adjusting a sample time 240, knowing an approximate, but not exact, time at which normal toggle 211 will arrive. An MRS 215 is transmitted to set DQS low drive bit 281 in an addressed memory 202, followed by a read command 209. A first sample time 240A is assumed. Host 201 determines, in a conventional manner, that the four pulses in normal toggle 211 are not correctly received when DQS receiver enable 217 is activated that early. A second read 209 is transmitted, and a second sample time 240B is assumed, again looking for when a leading edge of normal toggle 211 occurs. Sample time 240B is shown as being prior to a first transition of normal toggle 211. A third read 209 is transmitted and a third sample time 240C is assumed. The third sample time 240C occurs when the first transition of normal toggle 211 has occurred. Additional reads 209 and sample times 240 can be used to determine, as closely as desired, when the first transition of normal toggle 211 occurs. Host 201 then uses the information about when the first transition of normal toggle 211 occurs to properly time DQS receiver enable 217, storing the proper timing of DQS receiver enable 217 for use in subsequent read accesses of the addressed memory 202. Note that FIG. 4 shows an embodiment in which an MRS 215 command is sent to the addressed memory chip 202 prior to each read command. A second MRS 215 command may be transmitted to the addressed memory chip 202 to reset its DQS drive low bit 281. As described above with regard to FIG. 3, a plurality of read commands 209 may follow a single MRS 215 command, thereby speeding the process of determining proper timing of DQS receiver enable 217 for a particular memory 202.

FIG. 5 shows a block diagram and truth tables for driving data strobe 205; in particular, the DQS 203 signal of a differential data strobe 205. Similar block diagram and truth tables may be used to drive the complement DQS# 204 signal. If data strobe 205 is not a differential signal, the block diagram and truth tables shown in FIG. 5 describe driving data strobe 205. A CMOS (Complementary Metal Oxide Semiconductor) driver for DQS 203 is shown for exemplary purposes. A PFET (P-channel Field Effect Transistor) provides up-level drive for DQS 203; an NFET (N-channel Field Effect Transistor) provides down-level drive for DQS 203. A gate of the PFET is driven by Pdqs 231; a gate of the NFET is driven by Ndqs 232 as shown.

Pattern control 230 may control Pdqs 231 and Ndqs 232 per the truth tables shown in FIG. 5.

Pattern control 230 receives DQS low driver bit 281 which was described earlier. Pattern control 230 also receives a DLL clock 236 which is driven by a DLL (Delay Locked Loop) 233. DLL 233, in turn, receives a CLK In 234 signal from Host 201. DLL Clk 236 determines frequency of normal toggle 211 pulses. Pattern control 230 may also receive a standby 237, which is active except during normal toggle 211 or if a conventional preamble 110 is being used (a conventional preamble 110, as described in FIG. 1 may be used in some embodiments). As shown in the truth tables of FIG. 5, during preamble times (if a preamble is used), and during normal toggle 211, DQS low drive bit 211 has no effect on Pdqs 231 or Ndqs 232. However, during standby (when neither preamble 110 nor normal toggle 211 is active), Ndqs 232 is high, thereby turning on the NFET, which pulls DQS 204 low.

Figure 6:
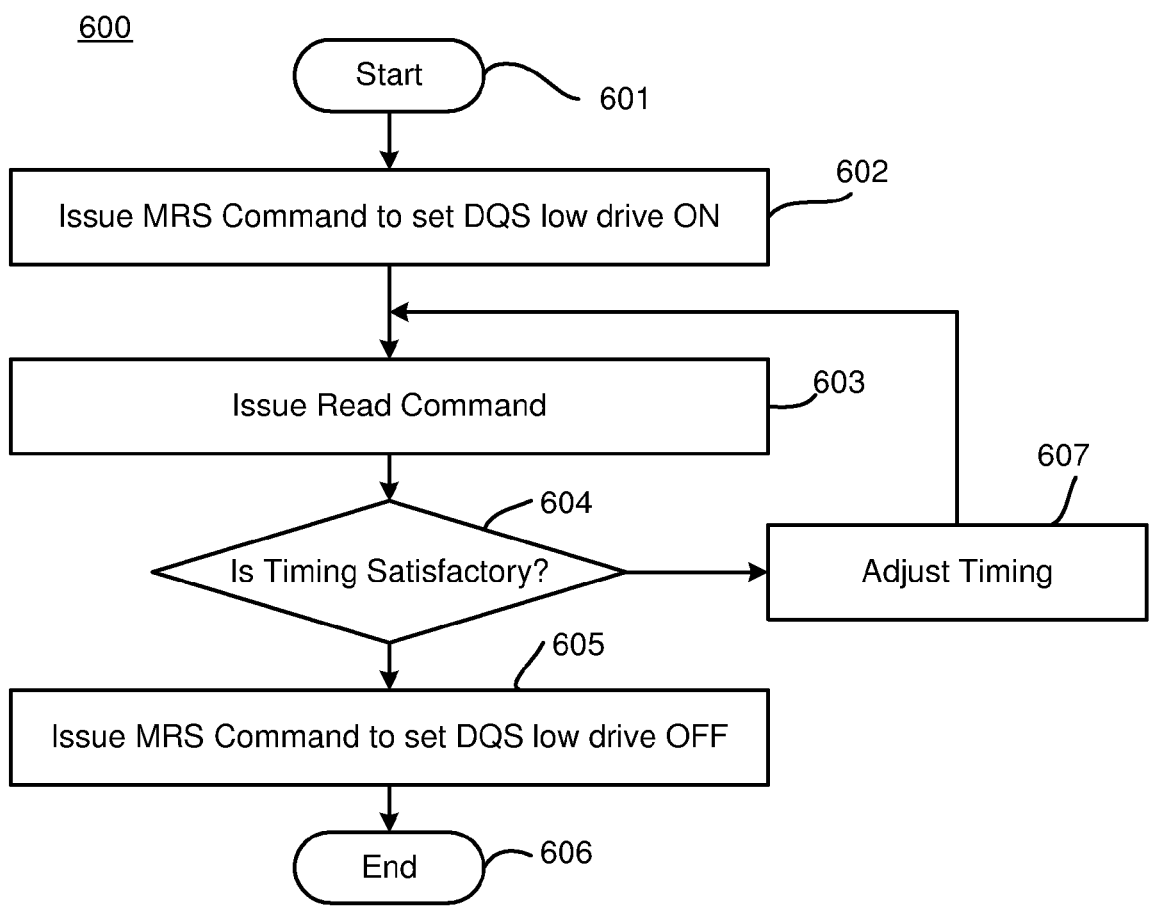
FIG. 6 shows a flow chart of a method performed during a training period wherein a receiver enable in the host is trained to properly receive a normal toggle transmitted by a memory chip.

FIG. 6 shows a flowchart of a method 600 for training DQS receiver enable 217 on host 201.

Method 600 begins at block 601.

In block 602, an MRS 215 command is transmitted to a particular memory chip 202 to activate DQS low drive bit 281 on the particular memory chip 202. In response, the particular memory chip 202, as described above, drives data strobe 205 (e.g., DQS 203 low; DQS# 204 high) low.

In block 603, host 201 transmits a read 209 command to the particular memory chip.

In block 604, host 201 checks to see if timing of DQS receiver enable 217 is satisfactory; that is, if DQS receiver enable 217 is placed properly with respect to normal toggle 211 as received by host 201. Various means of checking for satisfactory timing are known. For example, moving a sample time 240 "from left to right until timing of a first transition of normal toggle 211 is detected" was described earlier. Other known schemes, such as placing a first sample time late enough as to be assured of being in a middle of normal toggle 211, and working "to the left" until no more transitions are detected" may be implemented instead.

If block 604 determines that timing is not satisfactory, block 607 is used to adjust timing (e.g., moves sample time 240 "to the right" by a predetermined amount of time). Block 607 then passes control to block 603. If block 604 determines that timing is satisfactory, control passes to block 605, which issues an MRS 215 command to deactivate DQS low drive bit 281 on the particular memory chip 202.

Figure 7:
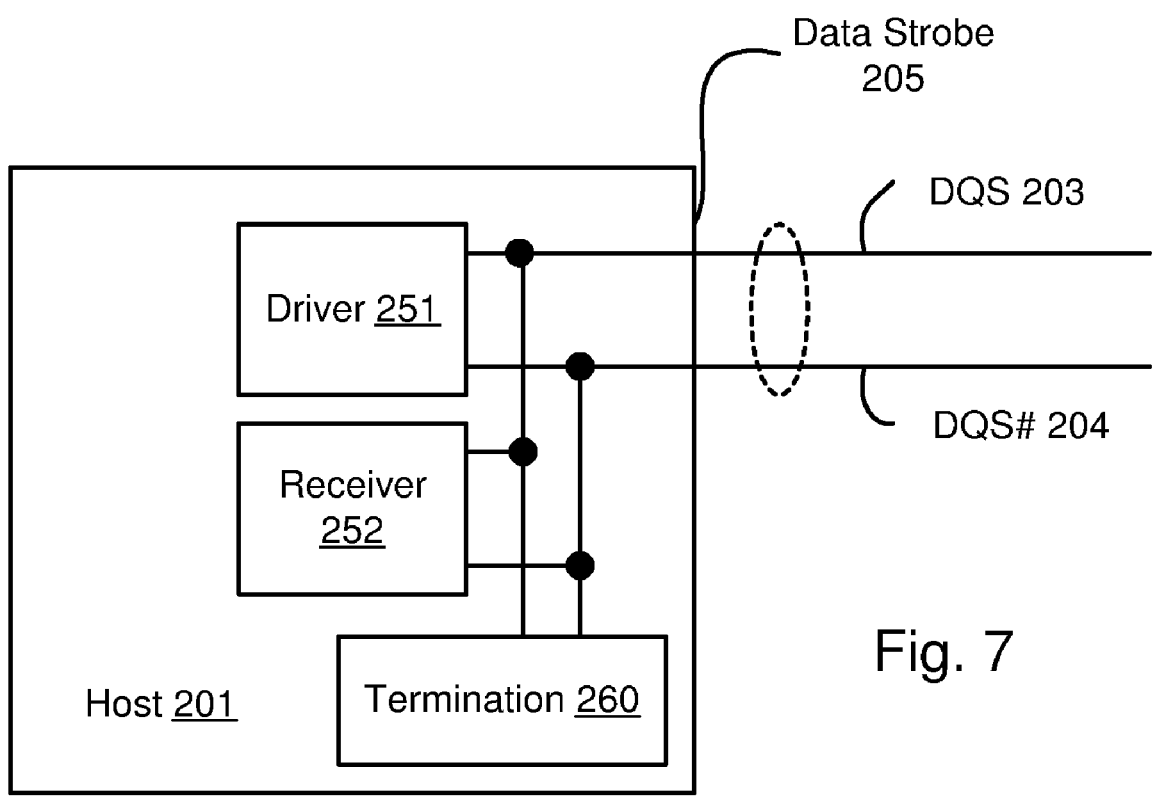
FIG. 7 shows a block diagram of an embodiment of a portion of a host, including a driver, a receiver, and a termination.
Figure 9:
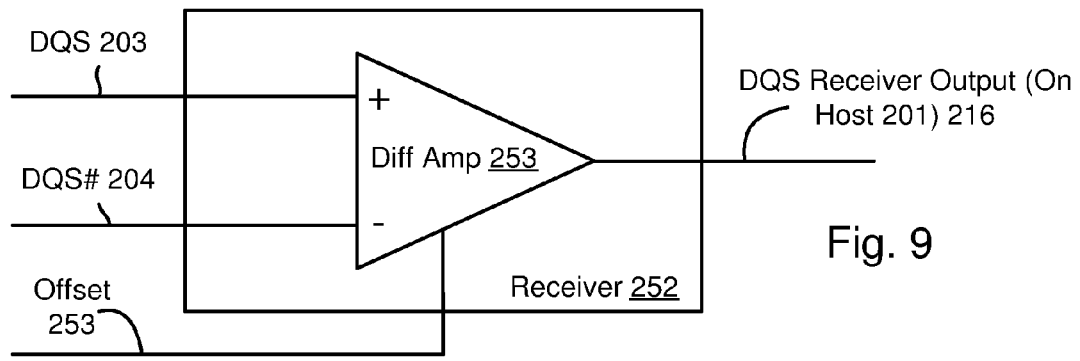
FIG. 9 shows an embodiment of a receiver having a differential amplifier on a host with a switchable offset.

FIGS. 7, 8, and 9 show more details of host 201, including termination details applicable to an embodiment wherein data strobe 205 is a differential signal and host 201 provides an offset voltage (offset 254, FIG. 10) between DQS 203 and DQS# 204.

Referring to FIG. 7, host 201 may comprise a driver 251 that drives data strobe 205 when host 201 is driving data strobe 205. Receiver 252 receives data strobe 205 driven by a memory chip 202, and is typically a differential receiver when data strobe 205 is a differential signal, as shown in FIG. 7. Termination 260 provides termination of data strobe 205, and may include an offset terminator. Termination 260 is shown in more detail in FIG. 8A and FIG. 8B.

Figure 8A:
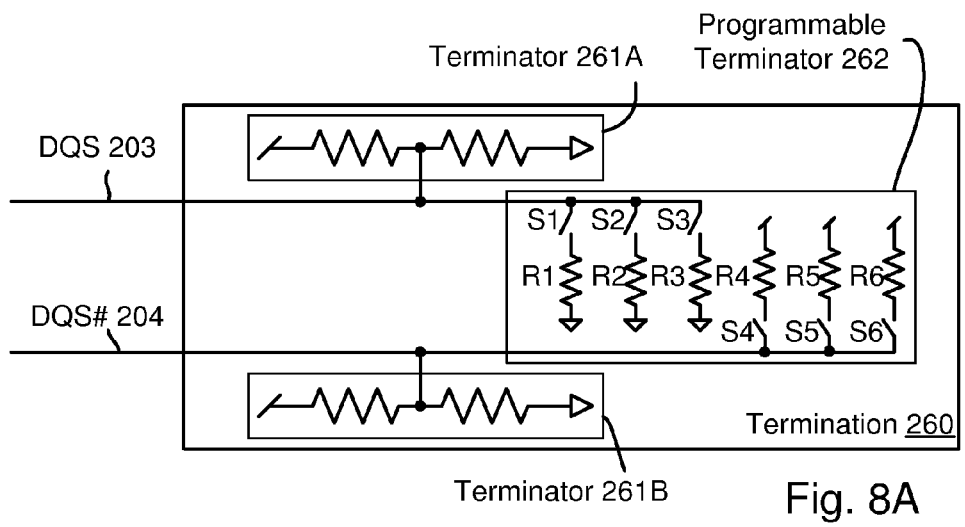
FIGS. 8A and 8B show schematics of embodiment of a termination in a host, including a programmable terminator and an offset termination scheme that preserves termination matching to a data strobe.

FIG. 8A shows a detailed embodiment of termination 260. Termination 260 receives DQS 203 and DQS# 204 as shown. Termination 260 may include non-switched terminators 261A and 261B which provide an appropriate termination for DQS 203 and DQS# 204 in order to prevent reflections.

Programmable terminator 262 is one embodiment for provision of switchable offset voltage between DQS 203 and DQS# 204. Host 201 may control one or more of switches S1, S2, and S3 to allow current to flow through R1, R2, and R3 to ground, respectively, thereby providing a pull-down on DQS 203. Similarly, host 201 may control one or more of switches S4, S5, and S6 to allow current to flow from a positive supply voltage to DQS# 204, thereby providing a pull-up on DQS# 204. More or fewer switch/resistor combinations may be attached to DQS 203 and DQS# 204. For example, in an embodiment, only one switch and its series resistor may be implemented for the pull-down on DQS 203 and for the pull-up on DQS# 204. In an embodiment, only DQS 203 has a switch/resistor combination. In another embodiment, only DQS# 204 has a switch/resistor combination. Switches may be implemented with appropriate FET (Field Effect Transistor) devices. In an embodiment, a switchable current source (not shown) is used instead of a switch/resistor combination. In an embodiment (not shown), series resistors with switches coupled to resistor/resistor connections and to ground or a positive supply are used. Any switchable mechanism to offset DQS 203 versus DQS# 204 is contemplated. If data strobe 205 is a single signal instead of a differential signal, terminator 260 would simply only have one or more switchable resistor/switch combinations to bias data strobe to a higher (or lower) voltage than a switching threshold of receiver (receiver 252 in FIG. 7) on the host.

Termination 260, as shown in FIG. 8A, assumes that impedance is not unacceptably changed with regards to properly matching transmission line impedance of DQS 203 or DQS 204. For example, if a Thevenized impedance of terminator 261A is 50 ohms, and the transmission line impedance of DQS 203 is 50 ohms, terminator 261A perfectly matches the transmission line impedance of DQS 203. In current technologies, offset 254 (FIG. 10) is approximately 50 mV (millivolts). Assume for example that, during the training period, DQS 203 and DQS# 204 are to be offset by closing switches S1 and S4. If R1 and R4 are each sized so that offset 254 (FIG. 10) is 50 mV, and terminators 261A and 261B are each 50 ohm terminators, termination 260 presents a 47.5 ohm termination to DQS 203 and DQS# 204. This may be acceptable.

Figure 8B:
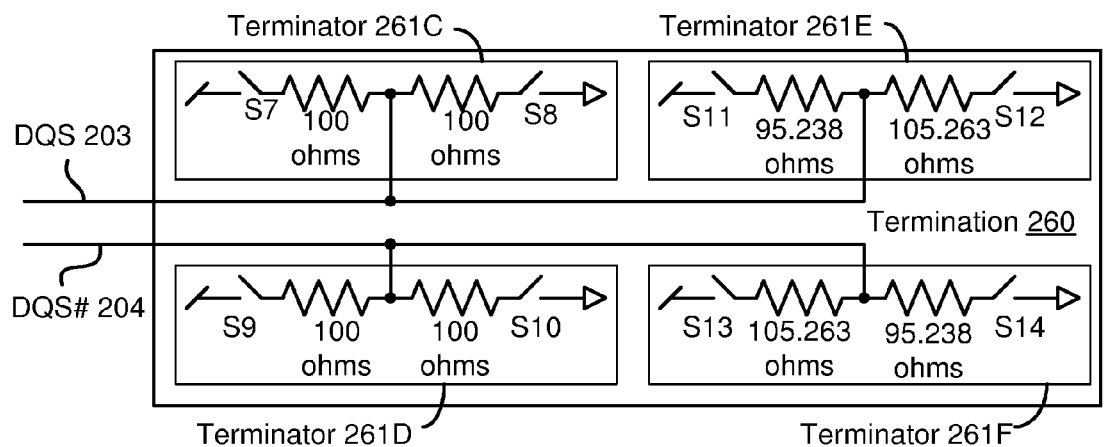

If such a termination mismatch is unacceptable, an alternative embodiment of termination 260 as shown in FIG. 8B will provide a Thevenized voltage of 0.525 volts and a Thevenized impedance of 50 ohms for DQS 203 and a Thevenized voltage of 0.475 volts and a Thevenized impedance of 50 ohms will be produced for DQS# 204. In FIG. 8B, termination 260 comprises terminators 261C and 261D which are used when host 201 is receiving on strobe 205 at a time other than during the training period. Terminators 261E and 261F are used during the training period. When terminators 261C and 261D are used, S7, S8, S9, and S10 are closed; S11, S12, S13, and S14 are open. During the training period, when an offset is desired, terminators 261C and 261D are disabled (opening switches S7, S8, S9, S10) and terminators 261E and 216F are enabled (closing switches S11, S12, S13, and S14. For example, to provide a 50 ohm termination, with a 0.525 mV Thevenized voltage, the switched in resistors in terminator 261E would be 95.238 ohms to Vdd and 105.263 ohms to ground and the switched in resistors in terminator 261F would be 105.263 ohms to Vdd and 95.238 ohms to ground.

In embodiments, terminators 261 and 261B may be switchable so that termination on the host 201 may be switched off when host 201 is driving data on data strobe 205.

If data strobe 205 has been in a high impedance state when terminator 260 is switched on or when impedance of terminator 260 is changed, is changed, host 201 may wait for a period of time determined by a designer for transients on data strobe 205 to die before transmitting a read command.

Figure 10:
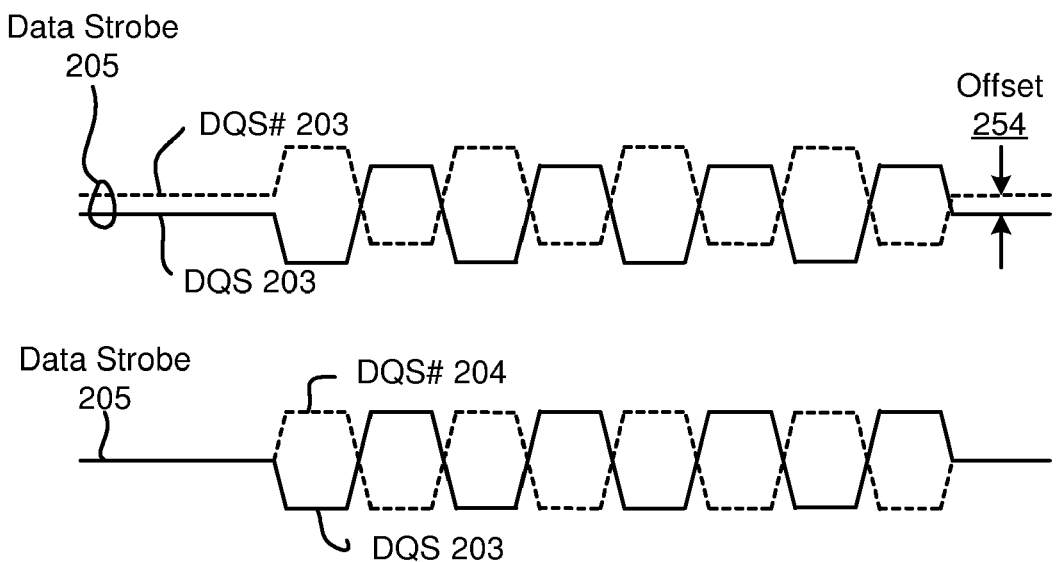
FIG. 10 shows a differential data strobe in which a true phase and a complement phase are offset during a training period.

FIG. 10 shows a differential data strobe 205 with an offset 254 imposed by terminator 260 (FIG. 8A or FIG. 8B) when no driver is driving data strobe 205. FIG. 10 also shows differential strobe 205 with no offset between DQS 203 and DQS# 204 when all switches (or equivalent current sources, etc) in terminator 260 are turned off; again when no driver is driving data strobe 205. Terminator 260, when controlled by logic in host 201 during the training period of DQS receiver enable 217 timing, must make offset 254 of DQS 203 and DQS# 204 enough to guarantee that receiver 252 will output a particular logic level.

Whereas discussion above has focused on physically offsetting a voltage on DQS 203 versus a voltage on DQS# 204, FIG. 9 shows a differential receiver with an offset control 253 that, when activated, provides a guaranteed logic value on DQS receiver output 216 when DQS 203 and DQS# 204 are not offset (i.e., are substantially at the same voltage), that same voltage determined, for example by non-switchable terminators 261A and 261B of FIG. 8A. Various ways of designing differential amplifier 253 to be biased when offset 253 is activated will be understood by those of skill in the art. For example, switchable FETs may be used on one or both sides of the differential receiver, making one side of the differential receiver "stronger" relative to the other side, thereby moving a switching threshold lower (e.g., by 50 mV) when the switches are activated.

FIG. 11 is a block diagram of blocks in host 201 that execute method 600. Receiver 252 (shown earlier in FIG. 7) receives data strobe 205. Receiver enable 254 receives an output of receiver 252 and drives the output of receiver 252 to DQS receiver output 216, subject to enablement by timing data 256 which initially contains assumed timing (e.g., sample time 240A, FIG. 4) per method 600 and will eventually contain correct, satisfactory, timing. Timing control 255 sends MRS 215 commands and read 209 commands to an addressed memory chip 202 during the training period of DQS receiver enable 217 as explained earlier. As shown, CMD driver 257 transmits commands to memory chips 202 on data 208; in alternative embodiments a separate command bus (not shown) may be used. Training control 255 also adjusts timing of DQS receiver enable 217 during the training period per block 607 of method 600 (FIG. 6), as explained with reference to FIG. 6.

Whereas a memory system 200 (FIG. 2) has been used to illustrate embodiments of the invention, it will be understood that memory system 200 is just one example of an electronic system, and teachings above apply in any electronic system having a bidirectional data strobe connected between semiconductor chips, wherein a training period between a first semiconductor chip (host 201, FIG. 2 is an example of a first semiconductor chip) and a second semiconductor chip (memory chip 202A, memory chip 202B of FIG. 2 are examples of a second semiconductor chip) allowing the first semiconductor chip to train a receiver to correctly receive a signal transmitted on the data strobe from the second semiconductor chip are contemplated.

What is claimed is:

1. A method of determining correct timing of a DQS receiver enable in a host connected to one or more memory chips using a bidirectional data strobe, the method comprising:
   transmitting a first Mode Register Set (MRS) command to set a DQS drive bit on an addressed memory chip to an active state on the addressed memory chip;
   assuming an initial timing for a DQS receiver enable;

iteratively performing the following blocks:
issuing a read command to the addressed memory chip;
determining if timing of the DQS receiver enable is correct;
when the timing of the DQS receiver is correct, issuing a second MRS command to set the DQS drive bit to an inactive state on the addressed memory chip and ending the iteration; and
when the timing of the DQS receiver is not correct, adjusting the timing of the DQS receiver enable and continuing the iteration.

2. The method of claim 1, the step of determining if timing of the DQS receiver enable is correct comprises:
assuming the initial timing that is known to be earlier than a normal toggle transmitted by the addressed memory chip on the bidirectional strobe could arrive at the host;
after each determination that the timing of the DQS receiver is not correct, delaying the timing by a predetermined amount.

3. The method of claim 1, the step of determining if timing of the dQS receiver enable is correct comprises:
assuming the initial timing to be late enough to be during reception of a normal toggle transmitted by the addressed memory chip on the bidirectional strobe;
after each determination that the timing of the DQS receiver is not correct, moving the timing earlier by a predetermined amount.

4. A method of determining correct timing for data strobe reception, by a host in a memory system, of a normal toggle transmitted by an addressed memory chip, the method comprising:
establishing an offset on a data strobe;
assuming, in the host, an initial timing for reception of the normal toggle;
iterating on the following blocks:
transmitting a read command to the addressed memory chip, the addressed memory chip responding by transmitting a normal toggle on the data strobe;
receiving the normal toggle in the host;
when the normal toggle is correctly received in the host, then storing the timing and ending the iteration; and
when the normal toggle is not correctly received in the host, adjusting the timing.

5. The method of claim 4, wherein establishing the offset on the data strobe comprises using a terminator in the host.

6. The method of claim 5, further comprising designing the terminator in to host to have the same impedance when the offset is established as an impedance of the terminator when the offset is not established.

7. A method of determining correct timing of a DQS receiver enable in a first semiconductor chip connected to one or more second semiconductor chips using a bidirectional data strobe, the method comprising:
transmitting a first Mode Register Set (MRS) command to set a DQS drive bit on an addressed second semiconductor chip to an active state on the addressed second semiconductor chip;
assuming an initial timing for a DQS receiver enable;
iteratively performing the following blocks:
issuing a read command to the addressed second semiconductor chip;
determining if timing of the DQS receiver enable is correct;
when the timing of the DQS receiver is correct, issuing a second MRS command to set the DQS drive bit to an inactive state on the addressed second semiconductor chip and ending the iteration; and
when the timing of the DQS receiver is not correct, adjusting the timing of the DQS receiver enable and continuing the iteration.

* * * * *